Nov. 24, 1970 T. J. HUTTON 3,543,262

SIGNAL DISTRIBUTION CIRCUIT HAVING INDUCTIVE ATTENUATION MEANS

Filed May 19, 1967 2 Sheets-Sheet 1

INVENTOR
Thomas J. Hutton
BY
W. L. Stout
HIS ATTORNEY

Nov. 24, 1970 T. J. HUTTON 3,543,262

SIGNAL DISTRIBUTION CIRCUIT HAVING INDUCTIVE ATTENUATION MEANS

Filed May 19, 1967 2 Sheets-Sheet 2

INVENTOR
Thomas J. Hutton.
BY W. L. Stout
HIS ATTORNEY

United States Patent Office 3,543,262

Patented Nov. 24, 1970

3,543,262

SIGNAL DISTRIBUTION CIRCUIT HAVING INDUCTIVE ATTENUATION MEANS

Thomas J. Hutton, Swissvale, Pa., assignor to Westinghouse Air Brake Company, Swissvale, Pa., a corporation of Pennsylvania Filed May 19, 1967, Ser. No. 639,754
Int. Cl. H04m *11/04*; G05b *19/00*
U.S. Cl. 340—310 11 Claims

ABSTRACT OF THE DISCLOSURE

A signal distribution circuit which utilizes portions of a pair of preexisting electrical conductors or structures, without the need to destroy the physical integrity of the preexisting conductors. The circuit includes a signal source having a selected frequency fed into a first point along the preexisting electrical conductors or structures. A tuning device is coupled across the pair of conductors or structures at a second point. Finally, there is a tuned inductive loop intermediate the first and second points, which loop is positioned between and electrically coacts with the conductors or structures. The tuning device and the tuned inductive loop cooperate to distribute the constant frequency signal from the constant power level to a zero power level at the second point, whereby the signal distribution circuit effectively isolates at least one end of the circuit from passing the selected frequency signal.

Figure 1:
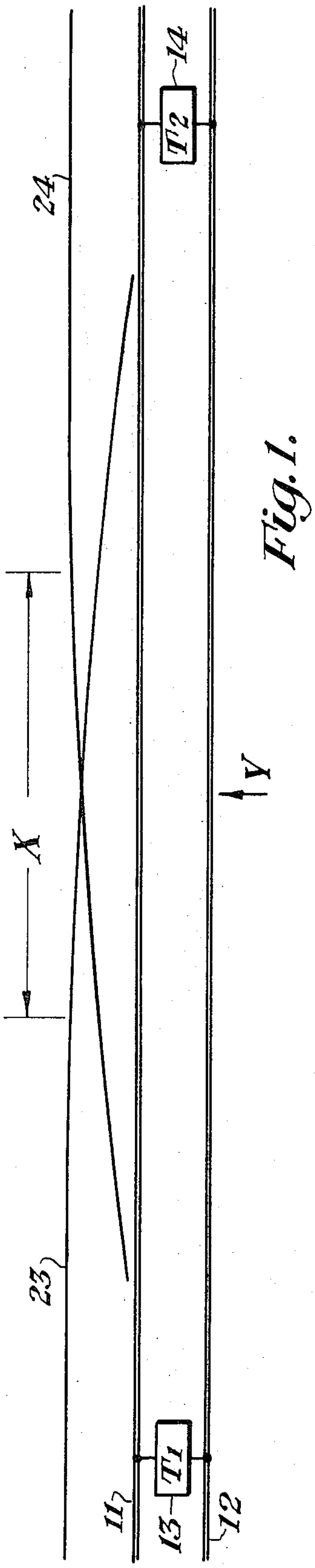

This invention relates to a signal distribution circuit.

More specifically this invention relates to a signal distribution circuit which utilizes portions of a pair of preexisting electrical conductors such as the continuous running rails of modern mass transit systems as well as other existing structures to be enumerated hereatfer. The circuit includes a signal source which has both a substantially constant frequency and which is fed into a first point along the preexisting electrical conductors. A tuning device is coupled across the pair of conductors at a second point. Finally, there is a tuned inductive loop intermediate the first and second points, which loop is positioned between and electrically coacts with the conductors. The tuning device and the tuned inductive loop cooperate to distribute the substantially constant frequency signal from the constant power level to a zero power level at the second point, whereby the signal distribution circuit effectively isolates at least one end of the circuit from passing the constant frequency signal.

Railroad and mass transit systems often make use of the running rails for purposes of signaling or communications. In principle, an audio or low frequency carrier is superimposed on the rails or between the traction current third rail and the running rails in subways or other electrified systems. The carrier may be used to indicate the presence of a train in a given area or may be modulated to provide voice or data transmission.

In many instances, it is desirable to isolate sections of track with respect to the carrier energy without physically altering the rails. Today the use of continuous rail as distinguished from rail having insulated joints is finding ever expanding use throughout the world. The continuous ribbons of steel rail extend for miles and when the rails are employed as the means for carrying information it becomes readily apparent that if a number of trains are to be present along the way defined by rails, then a number of transmitters must be employed to communicate with the trains. The presence or absence of any one or more trains will quite logically remove the shunting effect of the train's wheels from the rails, thereby allowing the transmission of signals from different transmitters to overlap or to be superimposed on each other. While this problem may be solved by the utilization of many different frequencies, the use of a range of different frequencies greatly increases the cost of the train-carried equipment. This is because the train-carried equipment must be made electronically sensitive enough to distinguish between the different frequencies.

Ideally the employment of a single frequency signal would represent a giant step forward in the area of cost reduction for both wayside and vehicle-carried equipment.

The prior art provides for the use of a capacitor shunt across the rails to establish isolation but this approach is highly objectionable when another transmitter must be placed adjacent the shunt because this type of shunt will not only isolate the signal but will simultaneously shunt the adjacent transmitter, thereby rendering the second transmitter useless. To this type of problem the invention to be described addresses itself and provides a solution with stunning simplicity which greatly advances the art.

It is therefore an object of this invention to provide a signal distribution arrangement which effectively isolates different signal sources and accomplishes this by the utilization of preexisting physical structures that are continuous throughout a system.

In addition it is another object of this invention to provide signal distribution and signal isolation between transmitters without the need to destroy the physical integrity of the preexisting structures being employed.

It is another object of this invention to provide a circuit arrangement which evenly distributes a transmitted signal over a portion of a circuit while effectively reducing the signal to a zero level at a predetermined point by the novel mutual cooperation of preexisting physical structures and a pair of tuned circuits which electrically coact with the preexisting structures.

Yet another object of this invention is to provide a unique track circuit arrangement for use in continuous rail territory which utilizes the running rails and/or other related structures along the way without the need to physically alter the rails or other structures to thereby provide one or more related track circuits for train detection or communication purposes.

In the attainment of the foregoing objects the invention contemplates the utilization of preexisting structures along a given way such as the running rails or the third rail and the running rails. Basically it is required that there be coupled to the rails a transmitter having a selected frequency output which is electrically coupled into the rails or other structure along the way at some selected first point. A tuning device, such as a series connected inductance and capacitance, tuned to the frequency of the transmitter, is electrically coupled across the rails at a second point. Lastly, an inductive loop tuned to parallel resonance with the frequency of the transmitter is placed between the rails in close association therewith at a point intermediate the transmitter at the first point and the tuning device at the second point, whereby the signal distribution circuit thereby established provides for the distribution of the transmitter's selected frequency output from a high level at the point of coupling to the rails to a null at the second point. The length of the circuit is defined by the positioning of the transmitter with reference to the tuned inductive loop and the tuning device, which last two components are always positioned adjacent each other.

Other objects and advantages of the present invention will become apparent from the ensuing description of illustrative embodiments thereof, in the course of which reference is had to the accompanying drawings in which:

FIG. 1 illustrates one of the conflicting signal problems to be solved by the invention.

Figure 1A:
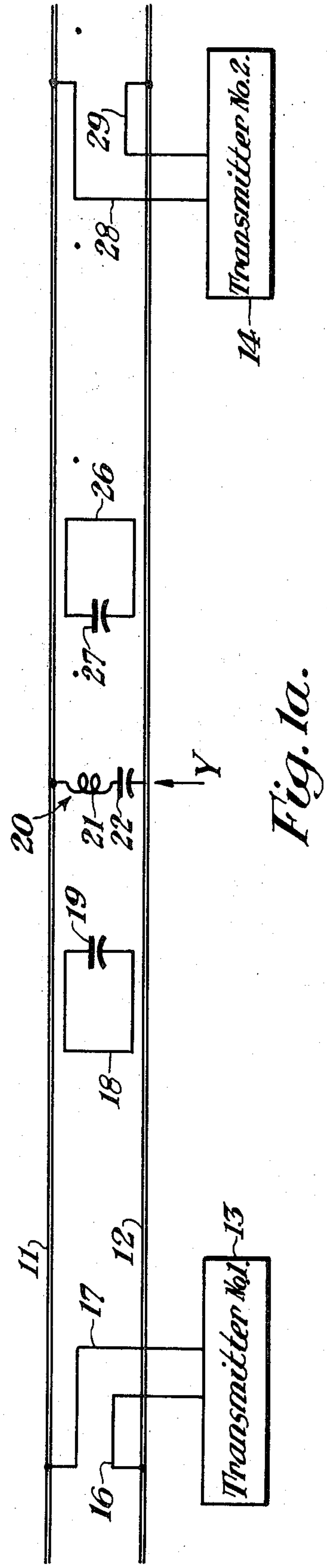

FIG. 1*a* depicts a circuit arrangement which incorporates one embodiment of the invention.

Figure 1B:
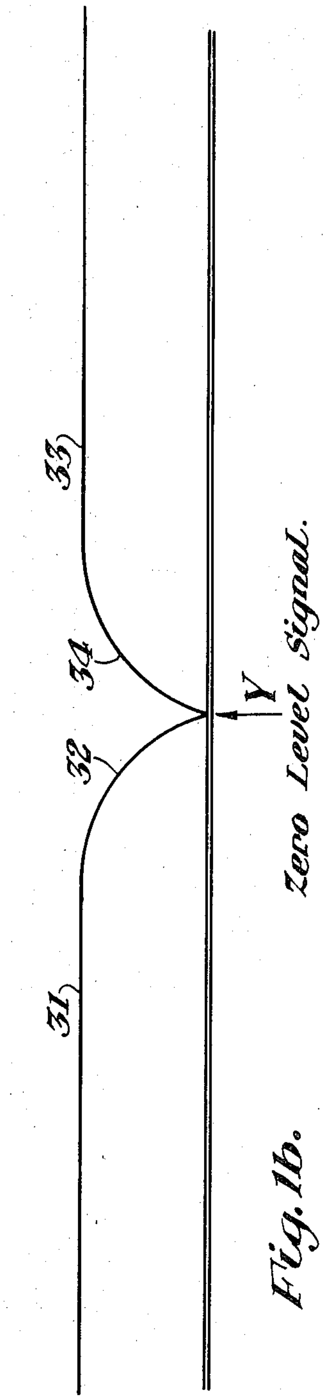

FIG. 1*b* graphically sets forth the signal distribution which is present in the circuit arrangement of FIG. 1*a*.

Figure 2:
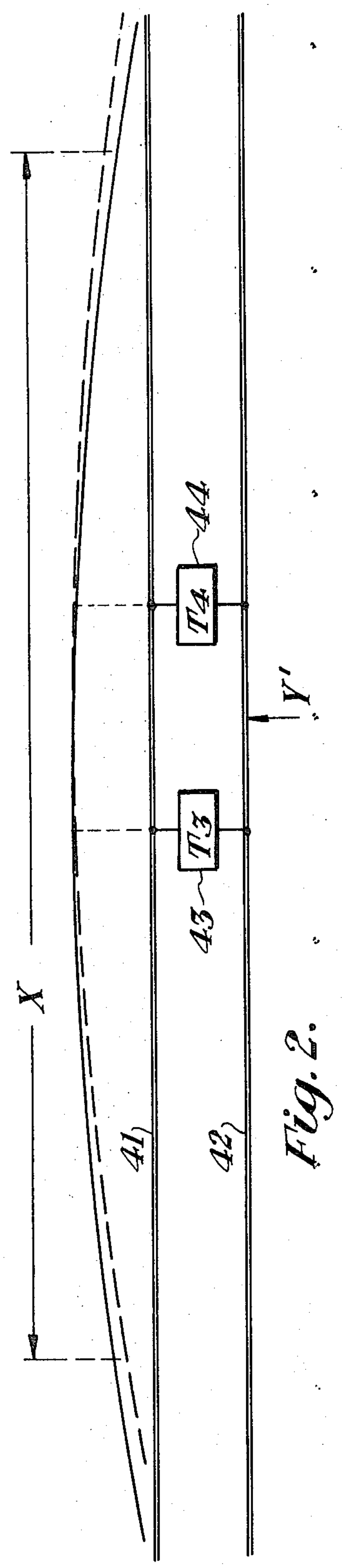

FIG. 2 illustrates another conflicting signal problem area solved by the invention.

Figure 2A:
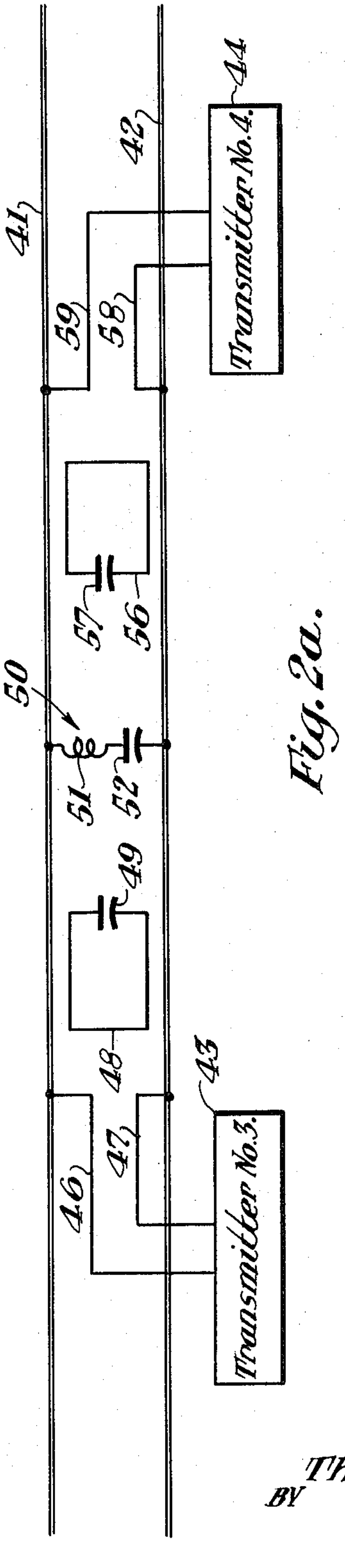

FIG. 2*a* depicts another circuit arrangement which incorporates another embodiment of the invention.

Figure 2B:
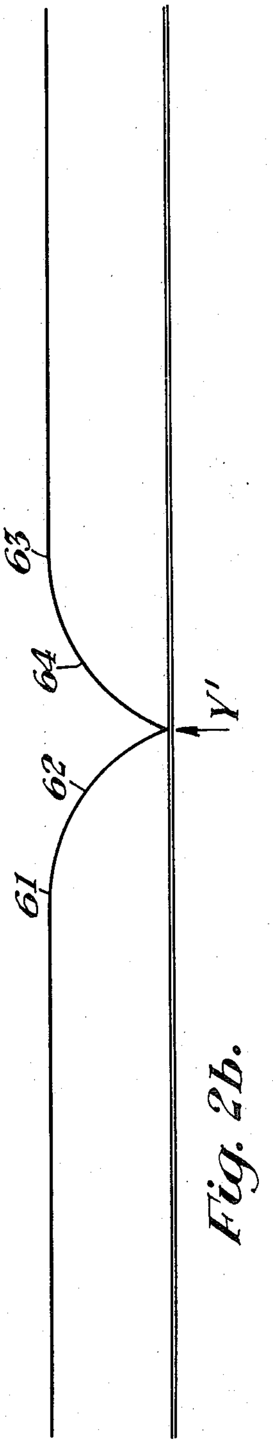

FIG. 2*b* graphically sets forth the signal distribution which is present in the circuit arrangement of FIG. 2*a*.

A description of the above embodiments will follow and then the novel features of the invention will be presented in the appended claims.

Reference is now made to FIG. 1 which depicts graphically the problems that arise when one or more transmitters are employed along the particular section of rail. The railway environment in which a pair of rails is employed is but one area where the invention may be employed. Accordingly, the preferred embodiment for purposes of discussion is so directed, but it should be understood that the concepts to be discussed may be employed whenever and wherever the objects noted earlier are to be accomplished.

FIG. 1 illustrates a pair of continuous rails 11 and 12, which rails 11 and 12 have coupled across them transmitters 13 and 14, designated respectively as T1 and T2. Directly above the rails 11 and 12 are a pair of curves designated 23 and 24. These curves 23 and 24 represent the propagation curve of the transmitted signal from either the transmitter T1 or the transmitter T2. Therefore, directly above the transmitter T1 there is a curve 23 which extends over an area on either side of the transmitter T1 and which falls off as the signal is attenuated because of its transmission along the rails 11 and 12. Above the transmitter T2 there is a curve 24 which represents the signal propagation curve of this transmitter, and intermediate the two transmitters T1 and T2 there is an area designated as X. This area X is the area of signal overlap which represents a problem area to be solved by the invention to be described hereafter.

While not depicted in this figure it should be appreciated that a vehicle traveling along the rails 11 and 12, which is receiving a communication from transmitter T1, will face a problem when the vehicle has passed the transmitter T1 in traveling from left to right. The vehicle having receivers at either end of the vehicle, not depicted here of course, would when it approached the area X receive signals from the transmitter T1, as well as the signals from the transmitter T2. At this point we have the difficult problem that finds its solution by way of the invention which is the subject of this application.

At the mid point between the transmitters T1 and T2, which mid point is designated by the reference character Y, it is desirable from the above problem to bring the signal to a null to accomplish the isolation of the transmitters T1 and T2. The problem would become extremely acute in the areas where a single frequency was being employed by both the transmitters T1 and T2. The solution to this problem of overlapping signals and conflict of communication that would result is found embodied in the circuit set forth in FIG. 1*a*.

It is to be understood that, throughout the remaining portions of the specification, wherever similar structure is present similar reference numerals will be used to expedite the understanding of the invention. Accordingly, FIG. 1*a* depicts the rails 11 and 12 which have coupled electrically across at the left-hand end a transmitter 13 which is electrically coupled to the rails 11 and 12 by the leads 16 and 17. At the mid point of the rail section here defined and designated by the reference character Y, there is provided a tuned shunt 20 which is comprised of an indcutor 21 and a capacitor 22 connected in series and across the rails. This tuned shunt 20 is tuned to the frequency transmitted by transmitter 13 just noted. Positioned between the rails and in close association therewith is a tuned loop 18 which has a capacitor 19 within the loop. This loop 18 and its capacitor 19 are tuned to parallel resonance with the frequency transmitted by transmitter 13. Positioned on the right-hand side of the track section here illustrated there is a second transmitter 14 which has been designated transmitter No. 2. Transmitter No. 2 will be delivering the same frequency signal as the transmitter No. 1. Transmitter No. 2 is electrically coupled across the rails 11 and 12 by the leads 28 and 29, and the energy from the transmitter No. 2 is transmitted down along the rails toward the mid point Y where the tuning device 20 is located. Intermediate the transmitter No. 2 and the mid point Y is a loop 26 with its loop also containing a capacitor 27, which loop and capacitor are tuned to parallel resonance with the frequency delivered by transmitter No. 2.

The utility and uniqueness of this invention are graphically presented in FIG. 1*b*, where there is an ideal plotted curve of a signal level versus distance along the rails. The curve 31 represents the signal which is required to provide a communication link to a vehicle passing along the rails 11 and 12 over the distance represented by the graph. As the signal is transmitted from transmitter No. 1 toward the mid point Y and the tuning device 20, the presence of the parallel resonant circuit in conjunction with the tuning device 20 produces a descending curve 32 which is representative of the attenuation established by the presence of the novel circuit arrangement illustrated in FIG. 1*a* immediately above.

With the incorporation of this invention the signal level at the mid point Y drops to zero as is ideally desired when vehicles are traveling along the way and wish not to receive conflicting signal information from subsequent transmitters.

It should at this time be noted that the tuning of the loop or loops present in the parallel tuned resonant loop established by lead 18 and capacitor 19 may produce two different modes of operation. In this instance the tuned loop 18 with its capacitor 19, coupled with the tuning device 20, establish an attenuation curve which effectively stops the passage of the frequency transmitted by transmitter No. 1. At the same time, while not depicted here, it should be recognized that for other frequencies different than transmitter No. 1, this tuned circuit would allow the passage of these signals down along the rails for subsequent use or receipt by other devices along the wayside, or by vehicles traveling along the rails 11 and 12.

To the right of the mid point Y, the parallel resonant circuit presented by the loop lead 26 and capacitor 27 provides a similar function to that set forth above with reference to the tuned loop to the left of the mid point Y, which circuit would comprise the lead 18 and capacitor 19. This tuned parallel resonant loop 26 with its capacitor 27 effectively attenuates the signal transmitted by the transmitter No. 2, which signal level is finally reduced to a null by the incorporation of the tuning device 20 across the rails 11 and 12.

FIGS. 1*a* and 1*b* graphically illustrate the solution to the vexing problem noted with reference to FIG. 1. For at the mid point Y, as shown in FIG. 1*b*, the signals from both transmitters No. 1 and No. 2 have been reduced to zero, thereby removing completely any area of conflict between the vehicles that travel along the way, as set forth earlier.

A second embodiment of this invention takes on a similar form as that depicted in FIG. 1*a*. The problem to be solved is graphically presented in FIG. 2, where there has been shown a pair of rails 41 and 42 which have coupled across transmitters T3 and T4, respectively designated 43 and 44. In this situation the transmitter T3 has its signal propagation curve depicted immediately above in a solid line fashion, while the signal propagation curve for the transmitter T4 is shown dotted. Note in this situation where two transmitters are in close proximity the area of conflicting signals here referred to as X' is very large producing an immense problem when the desirability of communicating to a vehicle traveling along the way is presented.

With the problem in mind of conflicting signals, as set forth in FIG. 2, the solution of this problem is illustrated graphically in the circuit diagram shown in FIG. 2*a*, where the pair of rails 41 and 42 have at their left-hand portion connected across these rails transmitter No. 3 designated by reference numeral 43. This transmitter 43 is electrically coupled across the rails 41 and 42 by leads 46 and 47. At the mid point between the transmitter No. 3 and the transmitter No. 4, designated by referance numeral 44, there is a tuning device 50 of the same type referred to with reference to FIG. 1*a*. This tuning device 50 is comprised of an inductor 51 and a capacitor 52 tuned to the frequency delivered to the rails by the transmitter No. 3 positioned on the left. This tuning device 50 also is tuned to the frequency of the transmitter No. 4, designated by reference numeral 44, which is electrically coupled across the rails by leads 58 and 59.

Positioned intermediate the coupling points of the transmitters No. 3 and No. 4 and the tuning device 50 are a pair of loops. The inductive loop comprised of lead 48 and capacitor 49 is tuned to parallel resonance with the frequency transmitted by transmitter No. 3, while the loop which includes the lead 56 and the capacitor 57, depicted to the right of tuning device 50, is tuned to parallel resonance with the signal transmitted by transmitter No. 4. Both of the loops just noted function in the same manner as the loops described in FIG. 1*a*, and it is of course readily evident when a study is made of FIG. 2*b*, that the curves which represent the propagation of the signals along the rails follow precisely the pattern established with reference to FIG. 1*b* and there is a zero level signal at the mid point Y'. The curves of signal propagation from transmitter No. 3 are represented by the signal curve portion 61 and the attenuated portion of the curve created by the incorporation of the parallel resonant circuit 48, 49 of the tuning device and series resonant circuit 50, represented by the decreasing curve 62 which comes to zero at the mid point Y' as is desired by the utilization of this invention. The propagation curve signal level from transmitter No. 4 has a portion 63 and a decreasing portion 64, which decreasing portion 64 goes to zero at the mid point Y'.

It is therefore evident that the incorporation of the circuits here described provides for the complete isolation of one transmitter signal source from an immediately adjacent transmitter signal source, and the problems that were illustrated with reference to FIG. 2 re the conflicting area signals designated by the reference character X' have been completely removed.

This invention just described achieves the desired isolation by inductively coupling tuned conductor loops into the track and shunting series tuned networks across the track. Here the track is used to designate any two parallel physical metallic structures. The parallel and series tuned networks allow a predictable band stop filter characteristic. High input impedances relative to the track and high attenuation of a signal are achievable over wide band widths. It should be realized that, while the discussion has been directed to a communication problem and conflicting signals, these circuits that have been described might also be utilized in a train detection scheme where the presence of a vehicle on the rails would provide a shunting action which would cause indication of the presence of a train in any particular track section. This arrangement has not been depicted but certainly is within the purview of the inventive concept here being described.

In concluding, it is readily apparent that the invention just described provides a novel means of producing a family of amplitude varying filters of the band stop variety using existing physical structures as a portion of the filter assembly. In particular, the selected embodiment is that of the running rails in a continuous rail train system. Also, the invention contemplates means of resonating railroad type running rails with third rail structures or with additional components or structures along the wayside. And while the embodiments set forth here for an explanation of the invention and its utility have made specific reference to the band stop quality of such an arrangement, it is intended that the principles involved may be used to produce the opposite transfer characteristics of the band stop filter, namely, a band pass filter. Therefore, whenever it is desired to provide, either the band stop function or the band pass function in any environment in which there are present continuous electrical conductors along the way, this invention may find utility and the invention is therefore not limited to the specific environments set forth in the description just made.

Furthermore, should different frequencies be employed, it should be understood that the addition of another series resonant connection across the rails (not shown) tuned to the different frequency noted is also contemplated.

While the present invention has been illustrated and disclosed in connection with the details of the illustrative embodiments thereof, it should be understood that those are now intended to be limitative of the invention as set forth in the accompanying claims.

Having thus described my invention, what I claim is:

1. A signal distribution circuit which utilizes portions of a pair of preexisting electrical conductors, said circuit comprising, (a) a signal source having a predetermined frequency signal electrically coupled across at a first point along said pair of preexisting electrical conductors, (b) a tuning device coupled across said pair of preexisting electrical conductors at a second point, (c) a tuned inductive loop intermediate said first and second point, positioned between and electrically coacting with said pair of preexisting electrical conductors, said tuning device and said loop cooperating to distribute said predetermined frequency signal from one level at the first point to a zero level at said second point, whereby the signal distribution circuit effectively isolates at least one end of the circuit from passing said predetermined frequency signal.

2. The signal distribution circuit of claim 1 wherein said tuning device across said preexisting electrical conductors is a series tuned circuit, tuned to said predetermined frequency.

3. The signal distribution circuit of claim 2 wherein said series tuned circuit includes an inductance means and a capacitance means.

4. The signal distribution circuit of claim 2 wherein said tuned inductive loop is located at a point remote from said first point and adjacent said tuning device whereby a circuit is defined in which the signal is distributed from said one level to said zero level between said first point and said remote point of said inductive loop.

5. The signal distribution circuit of claim 2 wherein said pair of preexisting electrical conductors are comprised of a portion of a pair of electrically continuous rails.

6. The signal distribution circuit of claim 3 wherein said tuned inductive loop includes a capacitance means and said loop is tuned to parallel resonance with said predetermined frequency source.

7. The signal distribution circuit of claim 2 wherein said tuned inductive loop is located at a point immediately adjacent both said first point and said second point.

8. The signal distribution circuit of claim 7 wherein said pair of preexisting electrical conductors are a portion of a pair of electrically continuous train rails.

9. A signal distribution circuit which utilizes portions of a pair of preexisting electrical conductors, said circuit comprising, (a) at least two predetermined frequency signal sources electrically coupled across and at a first and second point along said pair of preexisting electrical conductors, (b) at least one tuning device coupled across said pair of preexisting electrical conductors at a third point intermediate said first and said second points, (c) at least a first and a second tuned inductive loop, said first loop intermediate said first and third points, postioned between and electrically coacting with said pair of preexisting electrical conductors, said second loop intermediate said third and said second points, positioned between and electrically coacting with said pair of preexisting electrical conductors, said tuning device and both of said loops cooperating to isolate from each other said two predetermined frequency sources.

10. The signal distribution circuit of claim 9 wherein said first and said second tuned inductive loops are located adjacent said tuning device and at points remote from either of said two predetermined frequency sources.

11. The signal distribution circuit of claim 9 wherein said first and said second tuned inductive loops are located on either side of said tuning device and immediately adjacent said first and said second points.

References Cited

UNITED STATES PATENTS

| | | | |
|---|---|---|---|
| 2,591,022 | 4/1952 | Sorensen | 179—82 |
| 2,975,272 | 3/1961 | Renick et al. | 340—171 X |

HAROLD I. PITTS, Primary Examiner

U.S. Cl. X.R.

179—82; 340—171, 311